(12) United States Patent
Vogelsang et al.

(10) Patent No.: US 8,384,879 B2
(45) Date of Patent: Feb. 26, 2013

(54) OPTICAL POSITION SENSOR, A POSITION SENSITIVE DETECTOR, A LITHOGRAPHIC APPARATUS AND A METHOD FOR DETERMINING AN ABSOLUTE POSITION OF A MOVABLE OBJECT TO BE USED IN A RELATIVE POSITION MEASUREMENT SYSTEM

(75) Inventors: Patrick David Vogelsang, Eindhoven (NL); Martinus Cornelis Reijnen, Tilburg (NL); Tom Van Zutphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 902 days.

(21) Appl. No.: 12/499,612

(22) Filed: Jul. 8, 2009

(65) Prior Publication Data

US 2010/0033697 A1 Feb. 11, 2010

Related U.S. Application Data

(60) Provisional application No. 61/129,995, filed on Aug. 5, 2008.

(51) Int. Cl.
*G03B 27/54* (2006.01)
*G03B 27/42* (2006.01)

(52) U.S. Cl. ............................................ 355/67; 355/53

(58) Field of Classification Search ................. 355/53, 355/67; 250/458, 492.2; 257/459, 461
See application file for complete search history.

(56) References Cited

U.S. PATENT DOCUMENTS

| 4,887,140 | A | | 12/1989 | Wang | |
|---|---|---|---|---|---|
| 5,324,929 | A | * | 6/1994 | Yamada et al. | 250/214.1 |
| 7,705,285 | B2 | * | 4/2010 | Lysen | 250/214.1 |

* cited by examiner

*Primary Examiner* — Hung Henry Nguyen
(74) *Attorney, Agent, or Firm* — Pillsbury Winthrop Shaw Pittman LLP

(57) ABSTRACT

A sensor includes a semiconductor body having a top and bottom surface, a first doped surface oriented region of a first conductivity type at the top surface, and a second doped surface oriented region of a second and opposite conductivity type at the bottom surface, wherein a sensitive area is defined where the first region overlaps with the second region. A resistive layer is partially arranged in the sensitive area. The sensor includes two first electrode contacts and two second electrode contacts, wherein the first electrode contacts are placed on the resistive layer to define a first detection area in the sensitive area between the first electrode contacts, and wherein the second electrode contacts are placed partially in the sensitive area on the bottom surface of the body, the surfaces of the second electrodes in the sensitive area defining a second detection area that overlaps with the first detection area.

13 Claims, 4 Drawing Sheets

OPTICAL POSITION SENSOR, A POSITION SENSITIVE DETECTOR, A LITHOGRAPHIC APPARATUS AND A METHOD FOR DETERMINING AN ABSOLUTE POSITION OF A MOVABLE OBJECT TO BE USED IN A RELATIVE POSITION MEASUREMENT SYSTEM

CROSS REFERENCE TO RELATED APPLICATIONS

This application claims priority and benefit to U.S. Provisional Patent Application Ser. No. 61/129,995, entitled "Optical Position Sensor, A Position Sensitive Detector, A Lithographic Apparatus and a Method for Determining an Absolute Position of a Movable Object to be used in a Relative Position Measurement System", filed on Aug. 5, 2008. The contents of this application is incorporated herein in its entirety by reference.

FIELD

The present invention relates to an optical position sensor, a position sensitive detector, a lithographic apparatus and a method for determining an absolute position of a movable object to be used in a relative position measurement system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device and substrate are normally supported by a support structure, which is connected to a positioning device to accurately position the patterning device and substrate respectively in accordance with certain parameters. The position of these positioning devices are determined by a displacement sensor (e.g. an interferometric device, linear encoder or capacitive sensor) and at least one reference sensor which determines the "null" of the positioning devices. This "null" is preferably a six degree of freedom reference point for the positioning device with respect to a certain frame structure. An important parameter is the stability of the reference point over time and temperature. The requirements of this drift over time and temperature get more and more stringent. Current reference sensors may not be able to meet these and expected future requirements.

Commonly used reference sensors are so-called position sensitive devices (abbreviated as PSD). A PSD is an optical sensor that can measure the position of a light spot in one or two dimensions on a sensor surface. A PSD at least includes a diode structure, a resistive layer and electrode contacts. An example of a PSD is known from U.S. Pat. No. 4,887,140 the contents of which is herein incorporated by reference in its entirety. FIG. 1 of this document shows a one-dimensional PSD, whereas FIGS. 2-5 show different types of two-dimensional PSD's. The diode structure of a PSD is reverse biased. Incident radiation on the sensor surface between the electrode contacts creates a photocurrent, and the resulting currents through the electrode contacts are a measure of the position of the centre of gravity of the incident radiation. However, in a PSD, the reference point of the sensor is drifting over time and temperature. These drifts can be caused by (amongst others) local heating of the radiation spot and the PSD's reverse bias which may causes in-homogeneities in the resistive layer of the PSD.

SUMMARY

It is desirable to provide a reference sensor with an improved stability over time and temperature.

According to an embodiment of the invention, there is provided an optical position sensor including a single semiconductor body having a top and bottom surface, which body includes a first doped surface oriented region of one conductivity type at the top surface of the body, a second doped surface oriented region of opposite conductivity type at the bottom surface of the body substantially opposite to the first region, wherein a sensitive area is defined in which the first region overlaps with the second region seen from above, the sensor further including a resistive layer at least partially in the sensitive area, at least two first electrode contacts, and at least two second electrode contacts, wherein the first electrode contacts are placed on the resistive layer defining a first detection area in the sensitive area between the first electrode contacts, and wherein the second electrode contacts are placed at least partially in the sensitive area on the bottom surface of the body, the surfaces of the second electrodes that are in the sensitive area defining a second detection area, such that the first detection area and second detection area overlap seen from above.

According to an embodiment of the invention, there is provided a position sensitive detector including an optical position sensor including a single semiconductor body having a top and bottom surface, which body includes a first doped surface oriented region of one conductivity type at the top surface of the body, a second doped surface oriented region of opposite conductivity type at the bottom surface of the body substantially opposite to the first region, wherein a sensitive area is defined in which the first region overlaps with the second region seen from above, the sensor further including a resistive layer at least partially in the sensitive area, at least two first electrode contacts, and at least two second electrode contacts, wherein the first electrode contacts are placed on the resistive layer defining a first detection area in the sensitive area between the first electrode contacts, and wherein the second electrode contacts are placed at least partially in the sensitive area on the bottom surface of the body, the surfaces of the second electrodes that are in the sensitive area defining a second detection area, such that the first detection area and second detection area overlap seen from above, the position sensitive detector further including a voltage source to apply a reverse bias between the first electrode contacts and the second electrode contacts, and a measurement system to measure the currents through each individual first electrode contact and second electrode contact.

According to an embodiment of the invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, and at least one optical position sensor including a single semiconductor body having a top and bottom surface, which body includes a first doped surface oriented region of one conductivity type at the top surface of the body, a second doped surface oriented region of opposite conductivity type at the bottom surface of the body substantially opposite to the first region, wherein a sensitive area is defined in which the first region overlaps with the second region seen from above, the sensor further including a resistive layer at least partially in the sensitive area, at least two first electrode contacts, and at least two second electrode contacts, wherein the first electrode contacts are placed on the resistive layer defining a first detection area in the sensitive area between the first electrode contacts, and wherein the second electrode contacts are placed at least partially in the sensitive area on the bottom surface of the body, the surfaces of the second electrodes that are in the sensitive area defining a second detection area, such that the first detection area and second detection area overlap seen from above.

According to an embodiment of the invention, there is provided a method for determining an absolute position of a movable object to be used in a relative position measurement system, using an optical position sensor including a single semiconductor body having a top and bottom surface, which body includes a first doped surface oriented region of one conductivity type at the top surface of the body, a second doped surface oriented region of opposite conductivity type at the bottom surface of the body substantially opposite to the first region, wherein a sensitive area is defined in which the first region overlaps with the second region seen from above, the sensor further including a resistive layer at least partially in the sensitive area, at least two first electrode contacts, and at least two second electrode contacts, wherein the first electrode contacts are placed on the resistive layer defining a first detection area in the sensitive area between the first electrode contacts, and wherein the second electrode contacts are placed at least partially in the sensitive area on the bottom surface of the body, the surfaces of the second electrodes that are in the sensitive area defining a second detection area, such that the first detection area and second detection area overlap seen from above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
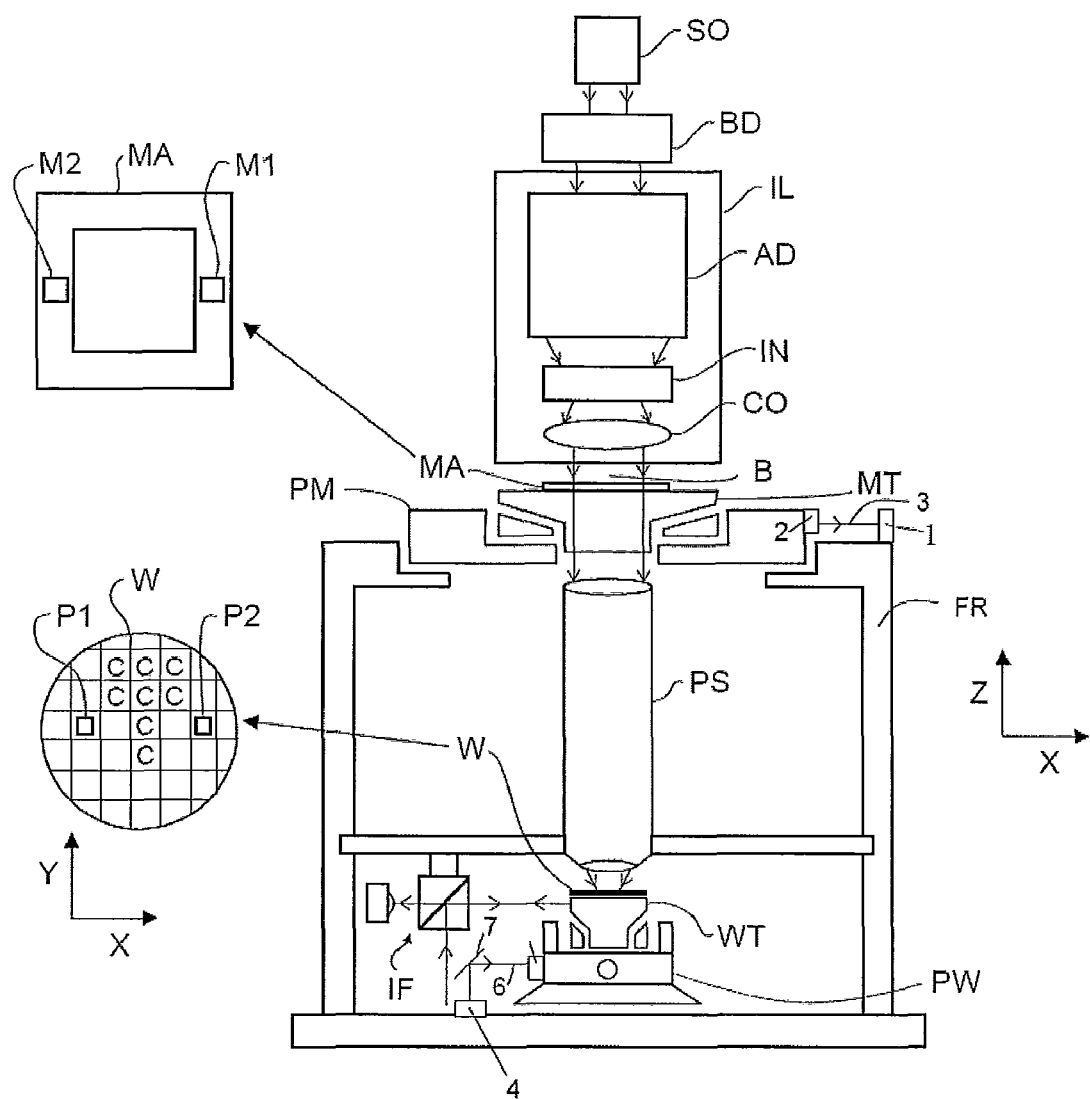
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In FIG. 1, reference sensors 1 and 5 provide a reference point with respect to a frame FR for respectively the first positioning device PM and the second positioning device PW. Preferably, a 6 DOF reference point is provided for each positioning device. In this embodiment, the reference sensors are optical position sensors according to an embodiment of the invention. Radiation/light sources 2 and 4 provide respectively radiation beams 3 and 6 which are incident to the reference sensors 1 and 5. Mirror surfaces, such as mirror 7 in this example may be provided to deflect the radiation beam in the direction of the reference sensor 5.

Four variants are possible for the locations of the radiation source and the reference sensor. In a first variant, the radiation source is arranged on the frame FR of the apparatus, and the reference sensor is arranged on the positioning device, as is the case for radiation source 2 and reference sensor 1.

A second variant is that the radiation source is arranged on the positioning device, and the reference sensor is arranged on the frame FR, as is the case for radiation source 4 and reference sensor 5.

Not shown in this example are a third and fourth variant, wherein both the radiation source and reference sensor are arranged on respectively the frame FR or the positioning device. These variants have an additional mirror surface on respectively the positioning device and frame FR in order to function properly. Which variant is chosen depends for example on the available space and design parameters of the frame and positioning devices, such as weight, stiffness, etc.

In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
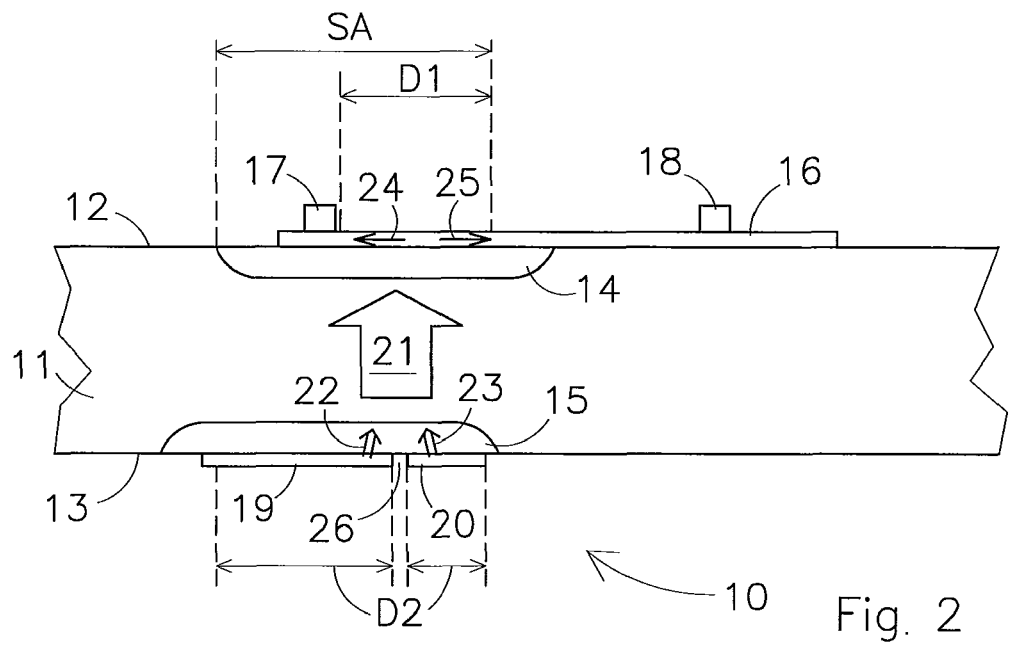
FIG. 2 depicts a cross sectional view of an optical position sensor according to an embodiment of the invention.

FIG. 2 depicts a cross sectional view of an optical position sensor 10 according to an embodiment of the invention. The sensor 10 includes a single semiconductor body 11. The body 11 has a top surface 12 and a bottom surface 13, the body further including a first doped surface oriented region 14 of one conductivity type at the top surface 12, in this case a p-type conductivity, and a second doped surface oriented region 15 of opposite or different conductivity type at the bottom surface 13, in this case a n-type conductivity. The first region 14 and second region 15 are placed opposite to each other, thereby creating an overlap area, seen from above, wherein the first region overlaps with the second region. The overlap area will be referred to as sensitive area SA.

In this embodiment, the body 11 also includes a layer of intrinsic semiconductor material separating the first region 14 and the second region 15. The sensor 10 further includes a resistive layer 16 on top of the first region 14 and two first electrode contacts 17 and 18 placed on the resistive layer 16. The resistive layer 16 can be made of semiconductor material too, but it is also possible to be made from a metallic or plastic material. Furthermore, the resistive layer 16 can be substantially transparent so as to reduce the absorption of the incident light beam.

The first electrodes 17, 18 define a first detection area D1 in the sensitive area SA between the two first electrodes 17, 18. The sensor 10 also includes two second electrode contacts 19 and 20 that are placed at least partially in the sensitive area SA. The surfaces of the second electrode contacts 19, 20 that are inside the sensitive area SA (seen from above) define a second detection area D2. The first and second electrode contacts 17-20 are placed such that the first detection area D1 overlaps with the second detection area D2 (seen from above).

The first region 14 and second region 15 together form a diode structure, because they are of opposite conductivity type. Preferably, the diode is reverse biased, which means in this case that the voltage applied to the second electrode contacts 19, 20 is higher than the voltage applied to the first electrode contacts 17, 18. Due to the reverse bias, the voltage will not generate a current between the first electrode contacts 17, 18 and the second electrode contacts 19, 20, except for a small dark current, inherent to diodes. The small dark current will be neglected in this description.

Incident radiation on the sensor 10 will penetrate the semiconductor body 11 and create electron-hole pairs in the semiconductor body 11, preferably in the intrinsic semiconductor layer. Due to the reverse bias this will result in a photocurrent represented by arrow 21. An incident radiation beam (not shown in FIG. 2) may come from above, but also from below. Preferably, the incident radiation beam is substantially perpendicular to the top surface 12 of the semiconductor. It is also preferred that only electron-hole pairs are created in the sensitive area SA (seen from above), more preferably only substantially in the area of the first detection area D1 and/or the second detection area D2 (seen from above). This can be achieved by, for instance, an opaque housing with a substantially transparent part, which part is adapted to match the shape of the first and/or second detection area, such that incident radiation will only penetrate the semiconductor body in the areas (seen from above). Alternative 'shielding' methods are also envisaged.

In this embodiment, the photocurrent 21 goes to the resistive layer 16 and is there split into a current 24 to first electrode contact 17 and a current 25 to first electrode contact 18. The currents 24 and 25 depend on the ratio between the resistances towards the two first electrode contacts. This resistance is mainly determined by the properties of the resistive layer and the distance from the centre of gravity of the incident radiation beam towards the corresponding first electrode contact. Therefore, the currents 24 and 25 are a measure for the position of the centre of gravity of the light radiation. A pair of first electrode contacts can determine the position of the centre of gravity of the radiation beam in one dimension. The working principle of the upper part of the sensor 10 is thus similar to that of a PSD. The sensor thus also has the benefits of a PSD. The main benefits of a PSD are the possibility to have a large measurement range to measure the position of a radiation beam and the fact that the measurement result is substantially independent on the diameter of the radiation beam and the shape as long as the radiation beam is smaller than the first detection area and is confined to the first detection area.

Photocurrent 21 is made up of current 22 coming from second electrode contact 19 and current 23 coming from second electrode contact 20. These currents 22, 23 are determined by the fact whether the electron-hole creation took place closer to second electrode contact 19 or second electrode contact 20. Seen from above this can also be expressed as that the magnitude of current 22 is determined by the amount of radiation incident to detection area D2 of corresponding second electrode contact 19, and that the magnitude of current 23 is determined by the amount of radiation incident to detection area D2 of corresponding second electrode contact 20. The working principle of the lower part of the sensor 10 is thus the same as for a photodiode array (PDA). The sensor 10 thus also has the attributes of a PDA. For example, the radiation beam can be positioned accurately with respect to a boundary 26 between the two second electrode contacts 19, 20, as long as both currents 22 and 23 are non-zero. The position with respect to the boundary 26 is not subject to drift due to time or temperature, because this position is determined by the physical location of the second electrode contacts 19, 20. The drift of the PSD is thus compensated for by the PDA being stable. In the PDA, the measurement range depends on the spot size. If the radiation beam is only incident to one second electrode contact, the position of the radiation beam can not be determined properly. This is compensated by the presence of the PSD-type sensor.

Figure 3:
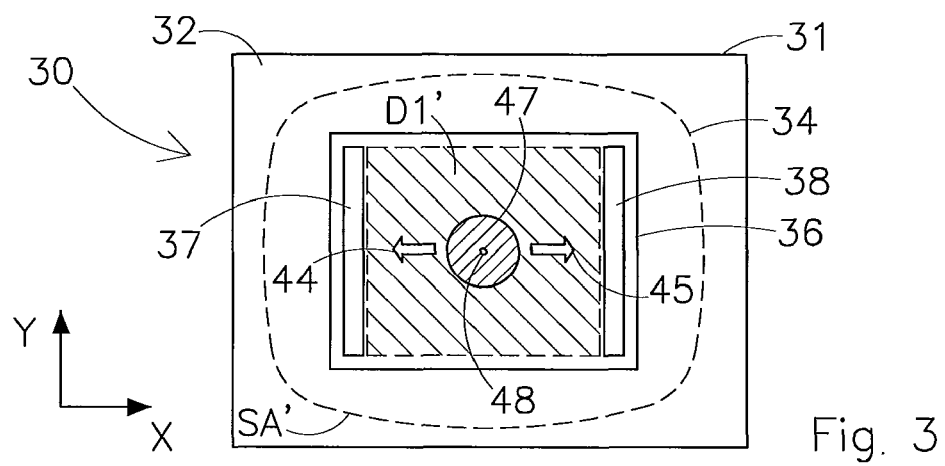
FIG. 3 depicts a top view of an optical position sensor according to an embodiment of the invention.

FIG. 3 depicts a top view of an optical position sensor 30 according to another embodiment of the invention. The working principle of sensor 30 is similar to that of the embodiment of FIG. 2. FIG. 3 thus depicts the 'PSD-side' of the sensor 30. Sensor 30 includes a semiconductor body 31 with a top surface 32. At the top surface 32 of the body 31, a first doped surface oriented region 34 of one conductivity type is provided, of which the boundary is shown. The boundary of the first region 34 here coincides with a sensitive area SA'. In the sensitive area SA' is located a resistive layer 36. On top of the resistive layer 36 are positioned two rectangular shaped first electrode contacts 37 and 38, parallel to each other, which first electrode contacts 37, 38 define a first detection area D1' between the two first electrode contacts 37, 38. A radiation beam hits the semiconductor body 31 from above or from below, wherein the projection of this radiation beam is represented by spot 47 having a center of gravity 48.

Provided that the first electrode contacts 37, 38 have a lower voltage than corresponding second electrode contacts on the bottom surface of body 31, the photocurrent generated in the body 31 by the light beam first goes to the resistive layer 36. The distance from the centre of gravity 48 to the first electrode contacts 37, 38 determines the ratio between currents 44 and 45 in the resistive layer 36 towards the first electrode contacts 37, 38. When the spot 47 shifts in the x-direction, the distances and thus the resistances to the first electrode contacts 37 and 38 change. This results in a dependency of the ratio between the currents 44 and 45 on the position of the spot 47. The rectangular shape of the first electrode contacts 37 and 38 and the fact that they are parallel to each other has the benefit that a substantially linear one-dimensional sensor is created, such that the sensor 30 is able to measure the position of the spot 47 in x-direction. When the spot 47 moves in the y-direction, the distances to the first electrode contacts 37 and 38 do not change, and therefore the currents 44 and 45 also do not change.

It is possible that the first electrode contacts do not have a rectangular shape. The shape of the first electrode contacts may influence the behavior of the sensor and by changing the shape it is for instance possible to improve the linearity. However, for the working principle of the sensor and especially in the case of a sensor serving as a reference point, the linearity of the sensor is relatively not important and thus the first electrode contacts can have any complex shape.

It is envisaged that the currents 44 and 45 can be normalized by the sum of the two currents 44 and 45. The dependency on the intensity of the light beam is then mainly eliminated.

Figure 4:
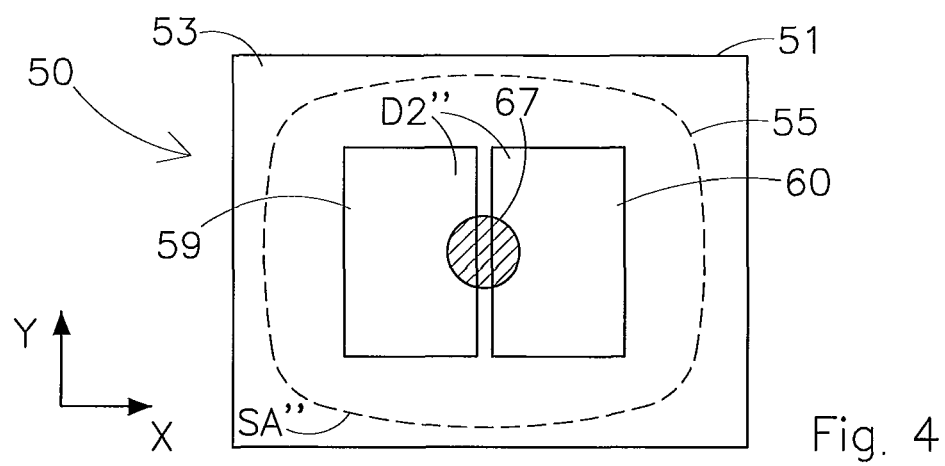
FIG. 4 depicts a bottom view of an optical sensor according to an embodiment of the invention.

FIG. 4 depicts a bottom view of an optical sensor 50 according to an embodiment of the invention. The working principle of sensor 50 is similar to that of the embodiment of FIG. 2. FIG. 4 thus depicts the 'PDA-side' of the sensor 50. Sensor 50 includes a semiconductor body 51 with a bottom surface 53. At the bottom surface 53 of the body 51 a second doped surface oriented region 55 of one conductivity type is provided, of which the boundary is shown. The boundary of the second region 55 here coincides with a sensitive area SA". In the sensitive area SA" are located second electrode contacts 59 and 60. Both second electrode contacts 59, 60 are rectangular shaped and parallel to each other in this embodiment. Preferably, the area between second electrode contacts 59, 60 is kept small compared to the overall size of the second electrode contacts 59, 60.

Because in this case, the entire surface of the second electrode contacts 59, 60 is located in the sensitive area SA", the entire surface of the second electrode contacts 59, 60 forms a second detection area D2". A radiation beam hits the semiconductor body 51 from above or from below, wherein the projection of this radiation beam is represented by spot 67. Each second electrode contact 59, 60 defines an area in the body 50 for which the distance to one second electrode contact is smaller than to the other second electrode contact. The amount of current from each electrode contact is determined by the amount of photocurrent generated in the corresponding area. If spot 67 moves for instance to the right in FIG. 4, the amount of photocurrent in the corresponding area of second electrode contact 60 will increase and the amount of photocurrent in the corresponding area of second electrode contact 59 will decrease, and thus the currents through each second electrode contact 59, 60 are a measure for the position of the radiation spot 67. A movement in y-direction of the spot 67 will not change the currents through the second electrode contacts 59, 60, and thus the sensor 50 acts as a one-dimensional position sensor. The benefit of such a sensor is that if radiation is incident to both second electrode contacts 59, 60, the position of spot 67 with respect to the second electrode contacts 59, 60 can be determined very accurately. This accuracy is partly lost, when the spot 67 is only incident to one second electrode contact.

Figure 5:
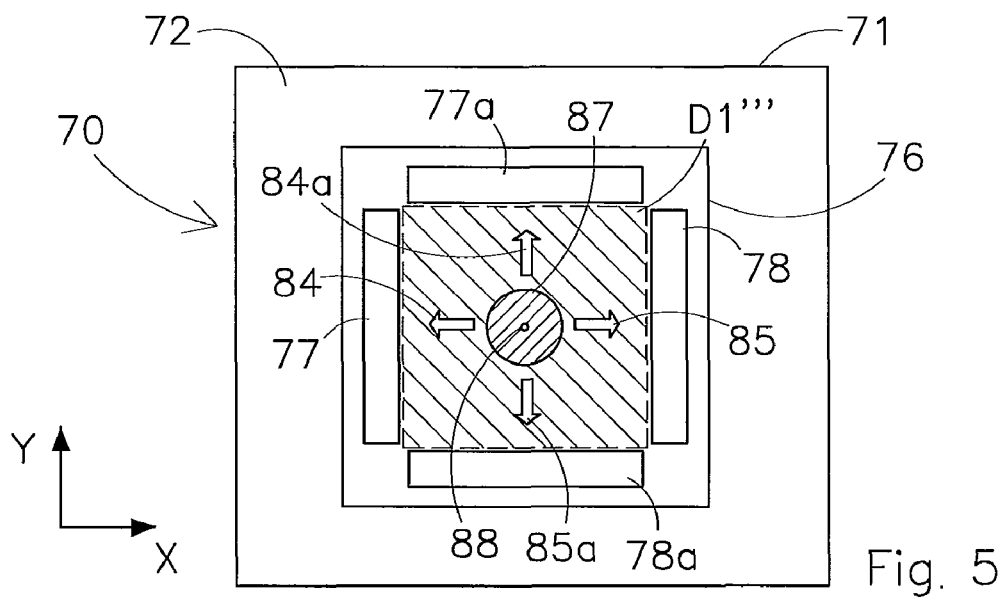
FIG. 5 depicts a top view of an optical position sensor according to an embodiment of the invention.

FIG. 5 depicts a top view of an optical position sensor 70 according to an embodiment of the invention. The working principle of sensor 70 is similar to that of the embodiment of FIG. 2. FIG. 5 thus depicts the 'PSD-side' of the sensor 70. The sensor 70 includes a semiconductor body 71 with a top surface 72. At the top surface 72 is located a first doped surface oriented region (not shown) defining in combination with a second doped surface oriented region (not shown) a sensitive area (not shown) similar to the embodiment of FIG. 3. In the sensitive area is, on the top surface 72, located a resistive layer 76. On the resistive layer are provided four first electrode contacts 77, 77a, 78, 78a. The first electrode contacts 77, 77a, 78, 78a form a rectangular shaped first detection area D1'", wherein the four first electrode contacts 77, 77a, 78, 78a each form a side of the first detection area D1'". A radiation beam hits the semiconductor body 71 from above or from below, wherein the projection of this radiation beam is represented by spot 87 with a centre of gravity 88.

The photocurrent generated by spot 87 in the body 71 is collected in the resistive layer 76 and split into four currents 84, 84a, 85 and 85a, flowing to the four first electrode contacts. The ratio between the four currents depends on the distances of the centre of gravity 88 to the corresponding first electrode contacts. The ratio between the currents 84 and 85 determines the position of the spot 87 in the x-direction, similar to FIG. 3. The ratio between the currents 84a and 85a determines the position of the spot 87 in the y-direction. Thus, sensor 70 is a two-dimensional position sensor.

Figure 6:
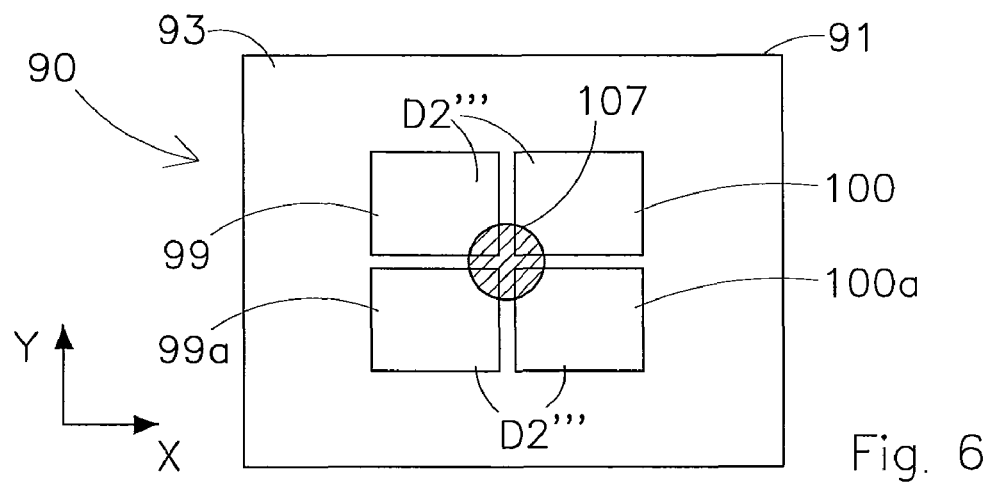
FIG. 6 depicts a bottom view of an optical position sensor according to an embodiment of the invention.

FIG. 6 depicts a bottom view of an optical position sensor 90 according to an embodiment of the invention. The working principle of sensor 90 is similar to that of the embodiment of FIG. 2. FIG. 6 thus depicts the 'PDA-side' of the sensor 90. The sensor 90 includes a semiconductor body 91 with a bottom surface 93. At the bottom surface 93 is located a second doped surface oriented region (not shown) defining in combination with a first doped surface oriented region (not shown) a sensitive area (not shown) similar to the embodiment of FIG. 4. In the sensitive area are provided four second electrode contacts 99, 99a, 100, 100a, arranged in a 2 by 2 array. The surfaces of the second electrode contacts define a second detection area D2'''. A radiation beam hits the semiconductor body 91 from above or from below, wherein the projection of this radiation beam is represented by spot 107. The radiation beam generates a photocurrent in the body 91.

Each second electrode contact 99, 99a, 100, 100a defines an area in the body 90 for which the distance to one second electrode contact is smaller than to the other second electrode contacts. The amount of current from each electrode contact is determined by the amount of photocurrent generated in the corresponding area. Due to the 2 by 2 array, the sensor 90 is now able to determine the position of the radiation spot 107 in two directions, as long as the radiation spot 107 is incident to all four second electrode contacts 99, 99a, 100, 100a.

This embodiment (and the embodiment of FIG. 4) shows that the detection range for the second electrode contacts is depending on the spot size. If the spot is too large, the entire second detection area is illuminated, and a shift in x- or y-direction will not result in changing current ratio's. If the spot size is too small, a small shift in x- or y-direction can result in no radiation hitting one of the second electrode contacts.

Figure 7:
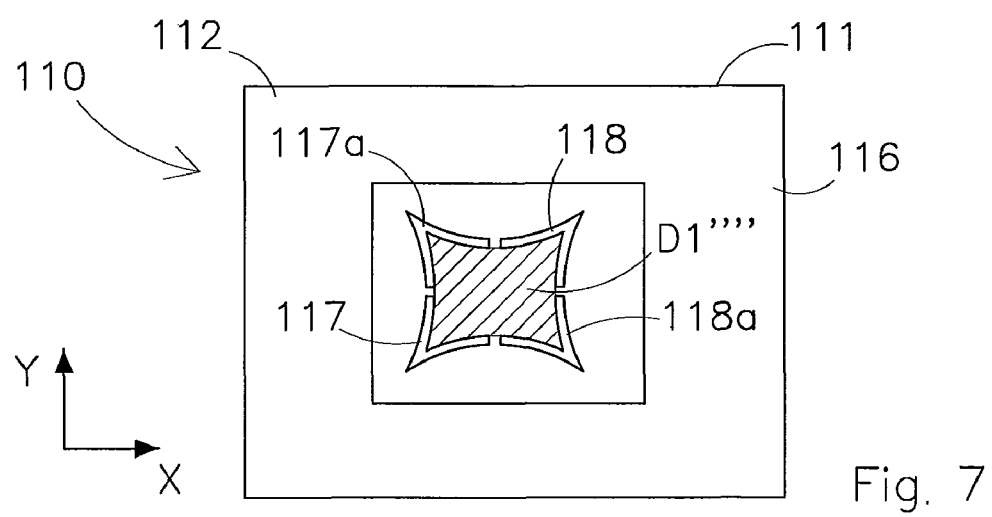
FIG. 7 depicts a top view of an optical sensor according to an embodiment of the invention.

FIG. 7 depicts a top view of an optical position sensor 110 according to an embodiment of the invention. The working principle of sensor 110 is similar to that of the embodiment of FIG. 2. FIG. 7 thus depicts the 'PSD-side' of the sensor 110. The sensor 110 includes a semiconductor body 111 with a top surface 112. At the top surface 112 is located a first doped surface oriented region (not shown) defining in combination with a second doped surface oriented region at the bottom surface (not shown) a sensitive area (not shown) similar to the embodiment of FIG. 3. In the sensitive area is, on the top surface 112, located a resistive layer 116. On the resistive layer are provided four first electrode contacts 117, 117a, 118, 118a. The first electrode contacts form a first detection area D1'''' having four vertices and four concave shaped sides. Each first electrode contact is placed in a vertex of the first detection area D1'''' and forms part of each adjoining side of the vertex. The benefit of this embodiment is that the linearity of the sensor is increased with respect to, for instance, the embodiment of FIG. 5. This linearity is not per se necessary, especially not if the sensor is only used for creating one single reference point. However, for control reasons, it can be beneficial if the sensor has a substantially linear behavior.

It is also envisaged that the linearity of a sensor according to, for instance, the embodiment of FIG. 5 can be improved by applying a certain gradient in the resistive layer. This can be done in combination with a certain shape of the first electrode contacts. The gradient in the resistive layer is than able to compensate at least partially for non-linearity's.

It should be noted that the invention is not limited to the shown embodiments and that many combinations of the above embodiments are possible. Also, variants defining other shapes of the first and second detection area are envisaged. The benefit of using one single semiconductor body and combine a PSD and PDA in one device is that a single photocurrent is generated. This in contrast to a solution which places a single PSD device and a single PDA device in series such that a light beam first hits one device, generates a photocurrent there, is transmitted partially and the remaining light beam hits the second device, where it also creates a photocurrent. The latter solution creates additional problems in properly combining the two devices which do not occur in a single device.

Figure 8:
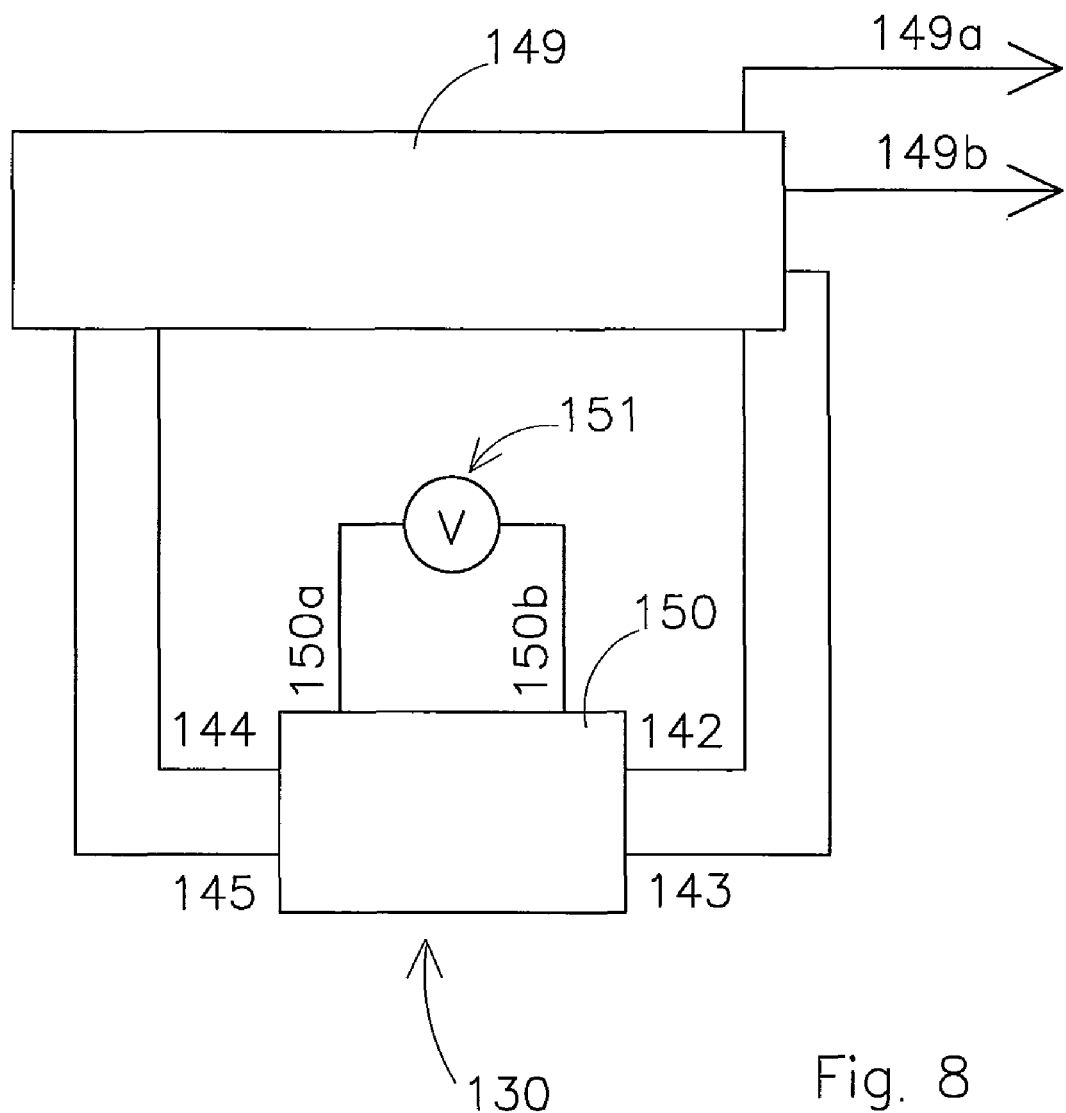
FIG. 8 depicts a sensor system according to an embodiment of the invention.

FIG. 8 depicts a position sensitive detector 130 according to an embodiment of the invention. The detector 130 includes an optical position sensor 150 according to an embodiment of the invention. The sensor 150 in this example is a one-dimensional sensor having two first electrode contacts (PSD) and two second electrode contacts (PDA) (not shown). Connected to the first electrode contacts is input 150a. Each individual first electrode contact is also connected to an associated output 144, 145. The second electrode contacts are connected to input 150b and each individual second electrode contact is also connected to an associated output 142, 143. A bias voltage is applied to the first electrode contacts by voltage source 151 through the inputs 150a, 150b. An incident radiation beam on the sensor 150 will result in currents through the first and second electrode contacts as is shown in FIGS. 2-7. These currents are fed to a measurement system 149 through the outputs 142, 143, 144, and 145. This measurement system 149 measures the individual currents and in this example creates output 149a and 149b, which are a measure for the position of the light spot incident to the sensor 150. Each output 149a, 149b corresponds to the "PDA" or "PSD" side of the sensor 150. The outputs 149a and 149b can be used for instance in a control system.

Now referring to FIG. 1 again. The reference sensors 1 and 5 are optical position sensors having a PSD and PDA side according to an embodiment of the invention. They can determine a reference point for the positioning devices PM and PW. Using two-dimensional sensors, it is possible that a 6 DOF reference point is created using three optical position sensors according to the invention. The two positioning devices can now be positioned in their corresponding reference point using a control system.

In an embodiment of the invention, the first detection area of the PSD side of the sensors is at least equal in size or larger than the second detection area of the PDA side of the sensors. This makes it possible for the PSD side to capture the laser beams. Upon capturing of the laser beams by the sensors, the control system can maneuver the corresponding position device such that the beam is roughly positioned in the centre of the PDA. The position of the positioning device is than fine-tuned using the PDA, which uses the physical center point of the PDA as reference point.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An optical position sensor comprising:
    a single semiconductor body having a top and bottom surface, the body comprising:
        a first doped surface oriented region of a first conductivity type at the top surface of the body,
        a second doped surface oriented region of a second conductivity type at the bottom surface of the body substantially opposite to the first doped surface oriented region, the second conductive type different from the first conductivity type, wherein a sensitive area is defined where the first doped surface oriented region overlaps with the second doped surface oriented region;
    a resistive layer at least partially arranged in the sensitive area;
    two first electrode contacts; and
    two second electrode contacts,
    wherein the first electrode contacts are placed on the resistive layer so as to define a first detection area in the sensitive area between the first electrode contacts, and wherein the second electrode contacts are placed at least partially in the sensitive area on the bottom surface of the body, the surfaces of the second electrodes in the sensitive area defining a second detection area that overlaps with the first detection area.

2. The sensor according to claim 1, wherein the semiconductor body further comprises a layer of mainly intrinsic semiconductor material separating the first doped surface oriented region and the second doped surface oriented region.

3. The sensor according to claim 1, wherein the first electrode contacts have a substantially rectangular shape.

4. The sensor according to claim 1, wherein the second electrode contacts have a substantially rectangular shape.

5. The sensor according to claim 1, comprising four first electrode contacts, wherein the first detection area has a substantially rectangular shape, and wherein each first electrode contact forms a side of the rectangular shape of the first detection area.

6. The sensor according to claim 1, comprising four second electrode contacts that form a 2 by 2 array.

7. The sensor according to claim 1, wherein the first detection area has a concave boundary.

8. The sensor according to claim 1, wherein the first detection area has a shape with at least three vertices, and wherein each first electrode contact is placed in a respective vertex and forms at least a part of each adjoining side of the vertex.

9. A position sensitive detector comprising:
    an optical position sensor comprising
        a single semiconductor body having a top and bottom surface, the body comprising:
            a first doped surface oriented region of a first conductivity type at the top surface of the body,
            a second doped surface oriented region of a second conductivity type at the bottom surface of the body substantially opposite to the first doped surface oriented region, the second conductive type different from the first conductivity type, wherein a sensitive area is defined where the first doped surface oriented region overlaps with the second doped surface oriented region;
        a resistive layer at least partially arranged in the sensitive area;
        two first electrode contacts; and
        two second electrode contacts,
        wherein the first electrode contacts are placed on the resistive layer so as to define a first detection area in the sensitive area between the first electrode contacts, and wherein the second electrode contacts are placed at least partially in the sensitive area on the bottom surface of the body, the surfaces of the second electrodes in the sensitive area defining a second detection area that overlaps with the first detection area;
    a voltage source configured to apply a reverse bias between the first electrode contacts and the second electrode contacts; and
    a measurement system configured to measure currents through each individual first electrode contact and second electrode contact.

10. A lithographic apparatus comprising:
    a patterning device support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate; and
    an optical position sensor comprising:
        a single semiconductor body having a top and bottom surface, the body comprising:
            a first doped surface oriented region of a first conductivity type at the top surface of the body,
            a second doped surface oriented region of a second conductivity type at the bottom surface of the body substantially opposite to the first doped surface oriented region, the second conductive type different from the first conductivity type, wherein a sensitive area is defined where the first doped surface oriented region overlaps with the second doped surface oriented region;
        a resistive layer at least partially arranged in the sensitive area;
        two first electrode contacts; and two second electrode contacts,
wherein the first electrode contacts are placed on the resistive layer so as to define a first detection area in the sensitive area between the first electrode contacts, and wherein the second electrode contacts are placed at least partially in the sensitive area on the bottom surface of the body, the surfaces of the second electrodes in the sensitive area defining a second detection area that overlaps with the first detection area.

11. The lithographic apparatus according to claim 10, wherein the sensor is used as a reference sensor for the substrate table.

12. The lithographic apparatus according to claim 10, wherein the sensor is used as a reference sensor for the support.

13. A method for determining an absolute position of a movable object to be used in a relative position measurement system, the method comprising:
    detecting a position of a radiation beam with an optical position sensor comprising:
        a single semiconductor body having a top and bottom surface, the body comprising:
            a first doped surface oriented region of a first conductivity type at the top surface of the body,
            a second doped surface oriented region of a second conductivity type at the bottom surface of the body substantially opposite to the first doped surface oriented region, the second conductive type different from the first conductivity type, wherein a sensitive area is defined where the first doped surface oriented region overlaps with the second doped surface oriented region;
        a resistive layer at least partially arranged in the sensitive area;
        two first electrode contacts; and
        two second electrode contacts,
        wherein the first electrode contacts are placed on the resistive layer so as to define a first detection area in the sensitive area between the first electrode contacts, and wherein the second electrode contacts are placed at least partially in the sensitive area on the bottom surface of the body, the surfaces of the second electrodes in the sensitive area defining a second detection area that overlaps with the first detection area.

\* \* \* \* \*